US 7,928,637 B2

(12) United States Patent
Comyn et al.

(10) Patent No.: US 7,928,637 B2
(45) Date of Patent: Apr. 19, 2011

(54) PIEZOELECTRIC MATERIALS

(75) Inventors: Timothy Comyn, Leeds (GB); Andrew John Bell, Grange-Over-Sands (GB)

(73) Assignee: Goodrich Control Systems, Solihull (GB)

( * ) Notice: Subject to any disclaimer, the term of this patent is extended or adjusted under 35 U.S.C. 154(b) by 393 days.

(21) Appl. No.: 11/663,458

(22) PCT Filed: Sep. 20, 2005

(86) PCT No.: PCT/GB2005/003627
§ 371 (c)(1),
(2), (4) Date: May 21, 2009

(87) PCT Pub. No.: WO2006/032872
PCT Pub. Date: Mar. 30, 2006

(65) Prior Publication Data
US 2009/0236947 A1 Sep. 24, 2009

(30) Foreign Application Priority Data
Sep. 22, 2004 (GB) .................................. 0421120.7

(51) Int. Cl.
*H01L 41/187* (2006.01)
(52) U.S. Cl. ........................................................ 310/358
(58) Field of Classification Search .................... 310/358
See application file for complete search history.

(56) References Cited
U.S. PATENT DOCUMENTS

| 4,977,547 | A | * | 12/1990 | Giniewicz et al. | ............. | 367/157 |
| 6,126,743 | A | * | 10/2000 | Saegusa et al. | .................. | 117/68 |
| 2005/0188916 | A1 | * | 9/2005 | Riman et al. | ..................... | 117/21 |
| 2007/0029592 | A1 | * | 2/2007 | Ramesh | ......................... | 257/295 |
| 2007/0029593 | A1 | * | 2/2007 | Ramesh | ......................... | 257/295 |
| 2007/0241642 | A1 | * | 10/2007 | Miyazawa et al. | ............ | 310/358 |
| 2008/0286587 | A1 | * | 11/2008 | Ahner et al. | .................. | 428/469 |
| 2009/0035877 | A1 | * | 2/2009 | Im et al. | .............................. | 438/3 |
| 2009/0155931 | A1 | * | 6/2009 | Ma et al. | ............................ | 438/3 |

FOREIGN PATENT DOCUMENTS

| CN | 101388335 A | * | 3/2009 |
| EP | 0208019 A2 | * | 1/1987 |
| JP | 03-69175 | | 3/1991 |
| JP | 03-069175 A | | 3/1991 |

OTHER PUBLICATIONS

Jin-Rong Cheng & L. E. Cross, Institute of Electrical and Electronics Engineers, "Lanthanum and Gallium Co-Modified BiFe03-PbTi03 Crystalline Solutions: Lead Reduced Morphotropic Phase Boundary (MPB) Piezoelectric Ceramics," 2003 IEEE Ultrasonics Symposium Proceedings, Oct. 5, 2003, pp. 354-357.
P. W. Lu et al., "Investigations of the Phase Diagram of the $PbTiO_3$-$BiFeO_3$ System," Applications of Ferroelectrics, 1994, ISAF '94, Proceedings of the Ninth IEEE Symposium, pp. 134-137.
International Search Report for PCT/GB2005/003627 dated Dec. 23, 2005.
IPRP and Written Opinion of the International Searching Authority for PCT/GB2005/003627 dated Mar. 27, 2007.

* cited by examiner

*Primary Examiner* — Thomas M Dougherty
(74) *Attorney, Agent, or Firm* — Miles & Stockbridge PC; David R. Schaffer; Stephen W. Aycock, II

(57) ABSTRACT

A piezoelectric perovskite mixed oxide compound has the general formula $(BiFeO_3)_x$—$(PbTiO_3)_{1-x}$ and contains up to 5 at % lanthanum or other rare earth substitution, in which x has a value in the range 0.5 to 0.9. Such compounds are capable of withstanding gas turbine operating temperatures and are suitable for use in sensing and actuation functions in aerospace and other applications.

14 Claims, 3 Drawing Sheets

PIEZOELECTRIC MATERIALS

CROSS-REFERENCE TO RELATED APPLICATION

This application is a 371 of International Patent Application No. PCT/GB2005/003627 filed on Sep. 20, 2005. This application also claims priority from application no. GB 0421120.7 filed Sep. 22, 2004. The entire content each of the foregoing documents is hereby incorporated by reference in the present application.

FIELD OF THE INVENTION

This invention relates to piezoelectric materials and especially, but not exclusively, provides piezoelectric materials capable of operating in and withstanding high temperatures such as those encountered in gas turbine engines.

BACKGROUND

Piezoelectric materials are used extensively as sensors and actuators in a wide range of applications and are conventionally based on lead zirconate titanate ($Pb(TiZr)O_3$), commonly known as PZT, especially where the ratio of lead titanate to lead zirconate is approximately 50:50, whereby the material exhibits a morphotropic phase boundary which has a mixture of tetragonal and rhombohedral symmetries. The piezoelectric property is realised after exposure of the compound to an electric field in excess of the coercive electric field which results in rotation of groups of dipoles referred to as domains. The material is then said to be "poled". The piezoelectric effect is only apparent at temperatures less than the Curie point and, in the case of PZT, the Curie point is in the region of 300° C., thus limiting the possible applications on an operating-temperature basis. Alternative piezoelectric materials to PZT, while having the capability to withstand higher operating temperatures, suffer a significant drawback in terms of sensitivity, that is, they exhibit only a small physical change in response to drive signals.

Known alternative piezoelectric materials to PZT include $BiFeO_3$—$PbTiO_3$ (BFPT), as disclosed in U.S. Pat. No. 4,977,547, and BFPT doped with manganese, as disclosed in U.S. Pat. No. 4,624,796, in each case for use in underwater hydrophone devices. Although it has been thought that BFPT materials may have higher-temperature applications, especially in exhibiting a piezoelectric effect which is largely independent of temperature within the permissible operating temperature range, they do require an abnormally high coercive field which makes it extremely difficult to realise their full potential without using thin sections to minimise the risk of dielectric breakdown.

U.S. Pat. No. 6,685,849 describes a perovskite solid solution having the general formula $(1-x) BiMeO_3-xPbTiO_3$, where Me is at least one suitably-sized cation selected from scandium, indium, yttrium, ytterbium, other rare earth metals, and combinations thereof, and x is a molar fraction between about 0.5 to 0.9. The perovskite system is said to provide superior high temperature properties compared with PZT compositions. Other possible Me cations mentioned include iron, gallium, magnesium, zirconium and nickel and the compounds may optionally be doped with other elements, including lanthanum, iron, manganese, niobium, tin and barium, to optimise their properties particularly as to the Curie point. However, of the Me cations exemplified, Sc provided a maximum Curie point of only 450° C., which is still below that required for gas turbine operating environments, although In and Yb held out the prospect of higher operating temperatures.

SUMMARY

We have now found that another group of compounds having perovskite structures provide piezoelectric materials which are capable of withstanding gas turbine operating temperatures and which at the same time exhibit sensitivity at such temperatures which render them suitable for use in sensing and actuation functions in aerospace and other applications.

In one aspect, the present invention provides a perovskite mixed oxide compound having the general formula $(BiFeO_3)_x$—$(PbTiO_3)_{1-x}$ containing up to 5 at % lanthanum or other rare earth substitution, in which x has a value in the range 0.5 to 0.9.

The rare earth elements are scandium, yttrium and lanthanum together with the lanthanides, cerium to lutetium. Of these, scandium, yttrium and lanthanum are preferred as substituents, either individually or in combination, in compounds according to the present invention. More preferably, lanthanum is the rare earth substituent at a level of up to 3.5 at % and x has a value in the range 0.5 to 0.8, more preferably 0.5 to 0.75. The lanthanum concentration is more preferably in the range 1.5 to 3.5 at %, for example 2.5% or 3.0%. The lanthanum may be substituted either for the bismuth and/or the lead components, but substitution for the lead is preferred.

A general formula for lanthanum-substituted bismuth compounds according to the invention is $Bi_{(x-y)}La_yFe_xPb_{1-x}Ti_{1-x}O_3$ where x is 0.5-0.8 and y is 0.015-0.035, and a general formula for lanthanum-substituted lead compounds according to the invention is $Bi_xFe_xPb_{(1-x-y)}La_yTi_{1-x}O_3$ where again x is 0.5-0.8 and y is 0.015-0.035.

Compounds in which the lanthanum is substituted for lead at higher doping concentrations within the above criteria are particularly preferred, since they enable high resistivity with a high piezoelectric coefficient to be obtained. Prior art compounds tend to suffer a trade-off in falling resistivity values as the piezoelectric coefficient is raised.

Co-dopants may be included with the lanthanum, especially indium, manganese, niobium, sodium and/or potassium, preferably at up to 1.0 at %, in order to suppress the conductivity without significantly lowering the Curie point and thus the effective maximum operating temperature.

Compounds according to the invention exhibit piezoelectric properties on being exposed to electric fields in excess of the coercive field and can be prepared by conventional mixed oxide synthesis in the form of sintered pellets. The pellets have been found to have a density greater than 95% of theoretical density, the compounds exhibiting a Curie point in excess of 620° C. The compounds are polycrystalline ceramics shown by XRD analysis to be perovskite phase pure with a mixture of rhombohedral and tetragonal phases, a morphotropic phase boundary existing therebetween, especially where x is 0.7±0.1. The rare earth dopant slightly decreases the Curie point compared with the undoped material but causes a higher threshold of dielectric breakdown with increasing field strength.

As an alternative to sintered pellets, compounds according to the invention may be cast on a moving tape as a wet slurry or slip, dried and removed from the tape. Electrodes may then be applied to the tape-cast surfaces and the tapes superposed and sintered to provide a multilayer or stacked array of tape-supported electrodes, alternate electrodes being electrically connected together, especially useful for low voltage applications such as Diesel piezo injectors, where it is desirable for the injectors to run from a 12 volt supply. However, in order to be able to use silver or base metal electrodes, such as copper or nickel which are cheaper than platinum group metal electrodes, it is necessary for the sintering temperature to be 1000° C. or lower, for example 950° C. for silver. Compounds according to the present invention are capable of being sintered at such temperatures without the use of vitreous sintering aids, necessary for PZT which otherwise requires a sintering temperature of around 1200° C., which while melting and promoting sintering nevertheless compromise the piezoelectric properties of the material.

The sintering step of the process, whether carried out on pellets or cast tapes, may be carried out in air or in alternative atmospheres, in order to raise the resistivity, and thus to improve the ability for hot poling and high temperature actuation. Possible alternative atmospheres include oxygen, nitrogen, mixtures of hydrogen and nitrogen and mixtures of oxygen and nitrogen, especially when used sequentially.

DESCRIPTION OF DRAWINGS

Embodiments of the invention will be described by way of example and with reference to the accompanying drawings of which.

DETAILED DESCRIPTION

Preparation of Compounds

Compounds in which lanthanum is substituted for bismuth were prepared by weighing the precursor powders ($Bi_2O_3$, $Fe_2O_3$, $La_2O_3$, PbO and $TiO_2$) in appropriate proportions, ball milling for 12 hours in 2-propanol, drying, and calcining at 925° C. for 4 hours in high purity alumina crucibles. The calcined powders were milled for a further 12 hours in acetone with 1 w/w % binder (Rohn and Haas B7), dried and pressed into 15 mm pellets. The binder was burnt out from the pellets which were subsequently fired at 1025° C. for 2 hours. The sintered pellets yielded a density of better than 95% of theoretical; a value of 8.15 g cm$^{-3}$ was used as the theoretical density as determined using the rhombohedral volume calculated from x-ray diffraction measurements.

The materials produced had a formula $Bi_{0.68}La_{0.02}Fe_{0.70}Pb_{0.30}Ti_{0.30}O_3$ (A) and $Bi_{0.63}La_{0.02}Fe_{0.65}Pb_{0.35}Ti_{0.35}O_3$ (B).

Figure 1:
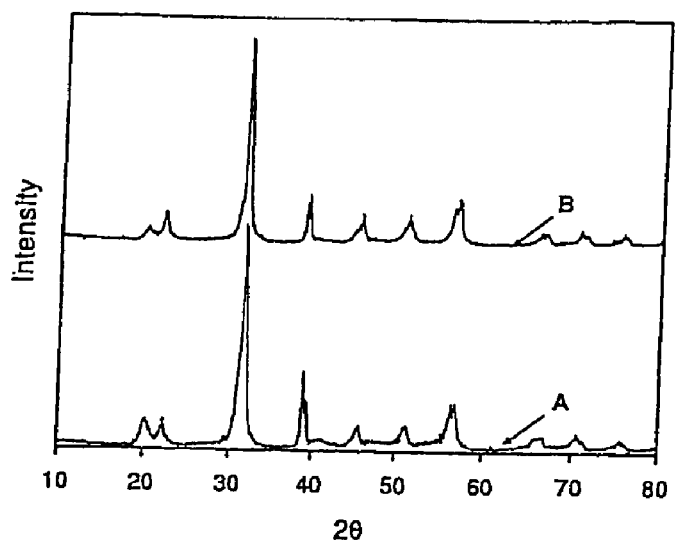
FIG. 1 shows XRD spectra for two compounds according to the invention ((A) and (B)), sintered at 1025° C. for 2 hours.

X-ray analysis of lapped pellets shows the materials to be a mixture of both tetragonal and rhombohedral phases. Deleterious non-perovskite phases such as $Bi_2O_{2.75}$ appear to be absent (FIG. 1). For the tetragonal phase in A and B, a=3.98 Å and c=4.38 Å and for the rhombohedral phase a=3.97 and tilt angle α=89.635°.

Figure 2:
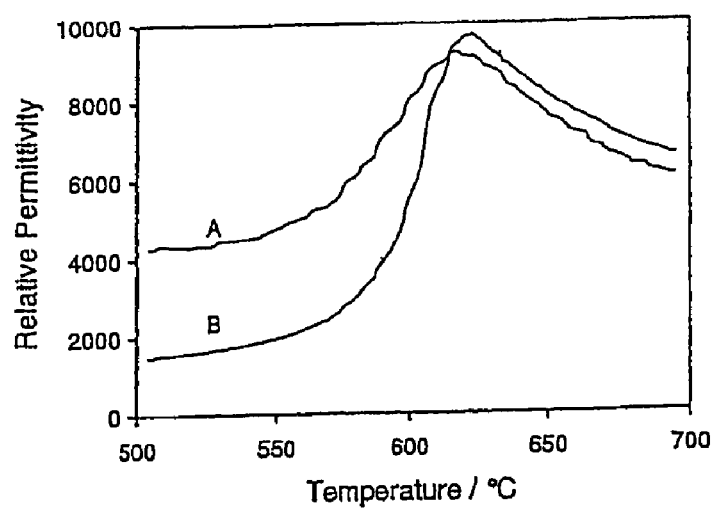
FIG. 2 shows relative permittivity for compounds (A) and (B), measured at 100 kHz against temperature.

The Curie point was determined via permittivity measurement as a function of temperature using an impedance analyzer, yielding values of 623° C. for A and 617° C. for B at a frequency of 100 kHz FIG. 2). This is slightly lower than for comparative undoped BFPT materials.

Figure 3:
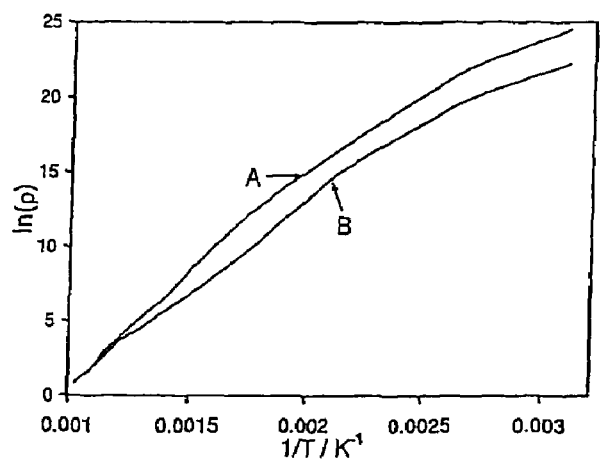
FIG. 3 shows calculated plots of activation energy of conduction for (A) and (B)

Resistivity measurements show values similar to undoped BFPT. From the data the activation energy of conduction can be calculated (FIG. 3). In the linear region of the plots (ignoring low and high temperature measurements which are prone to high errors) values of 1.05 eV for A and 1.12 for B were recorded. The room temperature resistivity of both A and B are better than $5\times10^{11}$ Ωm with an applied field of 1 MV m$^{-1}$.

Figure 4:
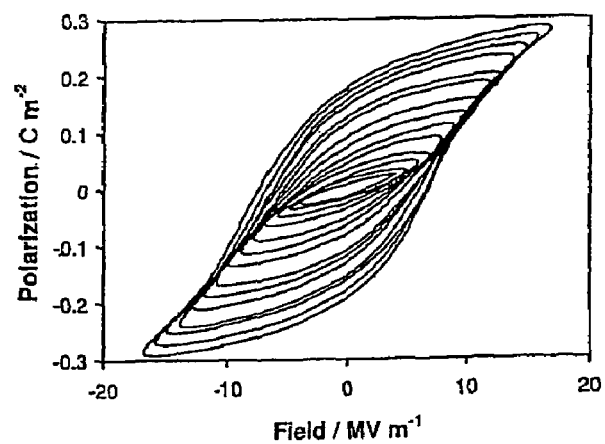
FIG. 4 shows polarization—field hysteresis loops for compound (A)

FIG. 4 shows PE loops for A for increasing maximum field strength at 100 Hz. The samples tested were thinned to 80 μm in order to increase the breakdown strength. For a field strength of 17 MV m$^{-1}$ the loops were not fully saturated; above this value, dielectric breakdown-occurred. With a field strength of 17 MV m$^{-1}$ a polarization of 0.3 C m$^{-2}$ was measured.

Thinned and electroded samples (0.6 mm thick) of composition A were poled at 6 Mv m$^{-1}$ for 30 mins at 75° C. in silicone oil yielding the coefficients measured at room temperature as shown in Table 1. Good agreement was obtained between Berlincourt and impedance methods for $d_{31}$.

Figure 5:
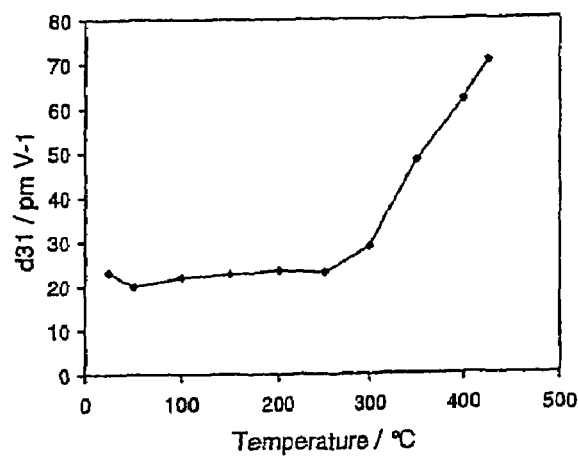
FIG. 5 shows a plot of $d_{31}$ v. temperature for compound (A), poled at $6MV^{-1}$ for 30 minutes in silicone oil.

A plot of $d_{31}$ vs. temperature (FIG. 5) shows a low change in $d_{31}$ as function of temperature between 25 and 250° C. (±8%). A large increase in $d_{31}$ occurs thereafter, which can be attributed largely to an increase in the dielectric constant with temperature.

TABLE 1

Measured piezoelectric properties for $Bi_{0.68}La_{0.02}Fe_{0.70}Pb_{0.30}Ti_{0.30}O_3$ pellets sintered at 1025° C. for 2 hours, then poled at 6 MV$^{-1}$ for 30 mins at 75° C. in silicone oil.

| Coefficient | Value | Measurement Method |
| --- | --- | --- |
| $d_{33}$/pm V$^{-1}$ | 90 | Berlincourt Meter |
| $d_{31}$/pm V$^{-1}$ | 25 | Berlincourt Meter |
| $d_{31}$/pm V$^{-1}$ | 23 | Impedance Analysis |
| $k_{31}$ | 0.141 | Impedance Analysis |
| $k_p$ | 0.237 | Impedance Analysis |
| $k_t$ | 0.2708 | Impedance Analysis |
| σ | 0.294 | Impedance Analysis |
| $s_{11}^E$/m$^2$V$^{-1}$ | 1.056 × 10$^{-11}$ | Impedance Analysis |
| $\epsilon_{33}^T$ | 285 | Impedance Analysis |

Figure 6:
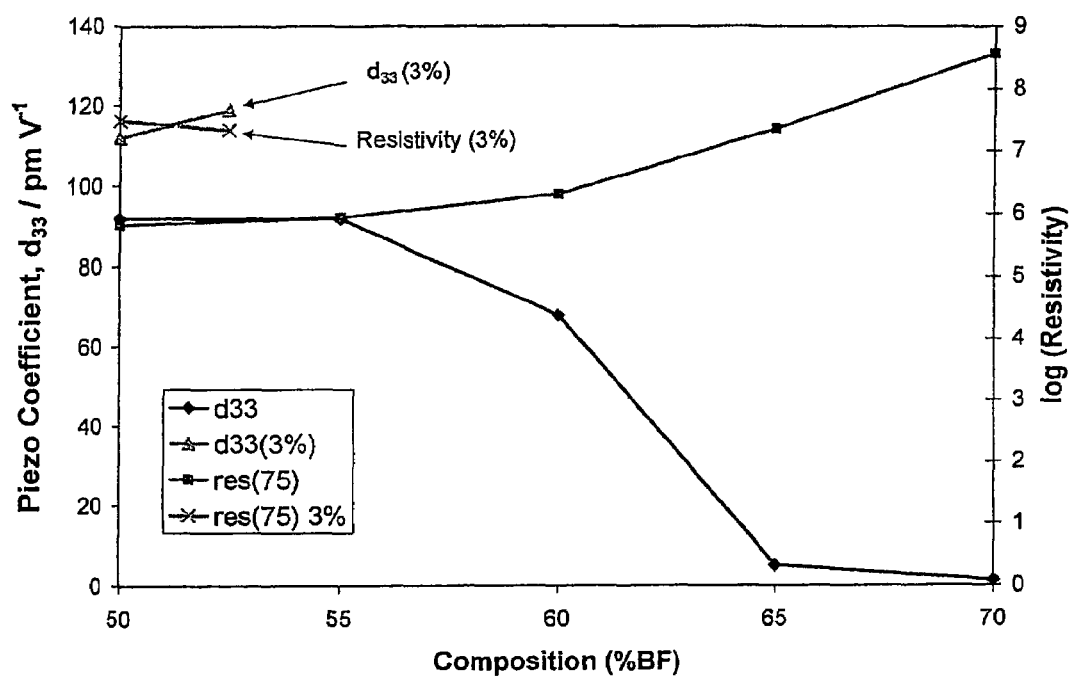
FIG. 6 shows a plot of $d_{33}$ and resistivity for various lanthanum-substituted lead compounds.

Other compounds according to the invention have been prepared in which the lanthanum is substituted for lead and is present at 2 at % and 3 at %. FIG. 6 shows results for $d_{33}$ (parallel to the electric field) piezoelectric coefficient and resistivity for compounds having the general formula $Bi_xFe_xPb_{(1-x-y)}La_yTi_{1-x}O_3$, where x is 0.5, 0.55, 0.6, 0.65 and 0.7 and y is 0.02 and for compounds where x is 0.5 and 0.525 and y is 0.03. It is seen that both the piezoelectric coefficient and resistivity are enhanced by an increase in lanthanum concentration.

Characterisation of the materials with respect to high field actuation has been carried out. Properties evaluated were the coercive field required for the materials to become poled and thus to exhibit piezoelectric properties; hysteresis and linearity; fatigue; and high field $d_{33}$ and total strain properties.

It has been found that, for the compound $Bi_{0.525}F3_{0.525}Pb_{0.445}La_{0.03}Ti_{0.475}O_3$, the $d_{33}$ piezoelectric coefficient is 120 pmV$^{-2}$ at low field and 160 pmV$^{-1}$ at high field, with total strains of 0.12%. This compares similarly with undoped PZT but provides an operating temperature of around 250° C. higher.

The invention claimed is:

1. A perovskite mixed oxide compound having the general formula $(BiFeO_3)_x$—$(PbTiO_3)_{1-x}$ containing substitution consisting essentially of lanthanum at a level of up to 3.5 at % based on the perovskite, in which x has a value in the range 0.5 to 0.8.

2. A compound according to claim 1, in which the lanthanum concentration is in the range 1.5 to 3.5 at %.

3. A compound according to claim 1, in which the lanthanum is substituted for lead.

4. A compound according to claim 3, in which the lead is substituted by lanthanum at a concentration in the range 2.5 to 3.5 at %.

5. A compound according to claim 1, including a co-dopant selected from indium, manganese, niobium, sodium and/or potassium at a concentration up to 1.0 at %.

6. A compound according to claim 1 in the form of a casting on a carrier tape.

7. Pellets comprising a perovskite mixed oxide compound having the general formula $(BiFeO_3)_x$—$(PbTiO_3)_{1-x}$ containing substitution consisting essentially of lanthanum at a level of up to 3.5 at % based on the perovskite, in which x has a value in the range 0.5 to 0.8, the pellets having been sintered.

8. Pellets according to claim 7, in which the sintering is carried out in an atmosphere other than air and comprising oxygen, nitrogen, mixtures thereof or mixtures of hydrogen and nitrogen.

9. Pellets according to claim 7, wherein the lanthanum is substituted for lead.

10. A multilayer piezoelectric device comprising a stacked array of tape castings, each tape casting including a compound having the general formula $(BiFeO_3)_x$—$(PbTiO_3)_{1-x}$ containing substitution consisting essentially of lanthanum at a level of up to 3.5 at %, in which x has a value in the range 0.5 to 0.8, the compound being in the form of a casting on a carrier tape, where surfaces on the tape castings include electrodes with alternate electrodes electrically connected together.

11. A device according to claim 10, in which the electrodes comprise silver or a base metal.

12. A device according to claim 10, the device having been sintered.

13. A device according to claim 12, in which the sintering is carried out in an atmosphere other than air and comprising oxygen, nitrogen, mixtures thereof or mixtures of hydrogen and nitrogen.

14. A device according to claim 10, wherein the lanthanum is substituted for lead.

* * * * *